United States Patent
Kung et al.

(10) Patent No.: US 9,831,188 B2
(45) Date of Patent: Nov. 28, 2017

(54) NOISE CANCELLATION FOR A MAGNETICALLY COUPLED COMMUNICATION LINK UTILIZING A LEAD FRAME

(71) Applicant: Power Integrations, Inc., San Jose, CA (US)

(72) Inventors: David Kung, Foster City, CA (US); David Michael Hugh Matthews, Los Gatos, CA (US); Balu Balakrishnan, Saratoga, CA (US)

(73) Assignee: Power Integrations, Inc., San Jose, CA (US)

( * ) Notice: Subject to any disclaimer, the term of this patent is extended or adjusted under 35 U.S.C. 154(b) by 0 days.

(21) Appl. No.: 15/138,013

(22) Filed: Apr. 25, 2016

(65) Prior Publication Data
US 2016/0240489 A1 Aug. 18, 2016

Related U.S. Application Data

(62) Division of application No. 14/332,743, filed on Jul. 16, 2014, now Pat. No. 9,349,717, which is a division
(Continued)

(51) Int. Cl.
*H01L 23/495* (2006.01)
*H05K 7/18* (2006.01)
(Continued)

(52) U.S. Cl.
CPC ........ *H01L 23/552* (2013.01); *H01L 23/3114* (2013.01); *H01L 23/48* (2013.01);
(Continued)

(58) Field of Classification Search
CPC ............ H02M 1/4258; H02M 3/33523; H01F 17/0006; H01F 2017/008;
(Continued)

(56) References Cited

U.S. PATENT DOCUMENTS 5,162,970 A 11/1992 Davis, Jr. et al.
5,428,245 A 6/1995 Lin et al.
(Continued)

FOREIGN PATENT DOCUMENTS

CN 101345479 A 1/2009
CN 102360729 A 2/2012
(Continued)

OTHER PUBLICATIONS

"ACSL-6xx0: Multi-Channel and Bi-Directional 15 MBd Digital Logic Gate Optocoupler," Avago Technologies, Feb. 5, 2009 (19 pages).
(Continued)

*Primary Examiner* — Simon Nguyen
(74) *Attorney, Agent, or Firm* — Christensen O'Connor; Johnson Kindness PLLC

(57) ABSTRACT

An integrated circuit package includes an encapsulation and a lead frame with a portion of the lead frame disposed within the encapsulation. The lead frame includes first and second conductive loops. A first voltage is induced between first and second ends of the first conductive loop in response to an external magnetic field that passes through the integrated circuit package. A second voltage is induced between third and fourth ends of the second conductive loop of the lead frame in response to the external magnetic field that passes through the integrated circuit package. The first conductive loop is coupled to the second conductive loop such that the first voltage between the first and second ends combined with the second voltage between the third and fourth ends substantially cancel.

14 Claims, 7 Drawing Sheets

Related U.S. Application Data of application No. 13/677,068, filed on Nov. 14, 2012, now Pat. No. 8,818,296.

(51) Int. Cl.

| | | |
|---|---|---|
| *H04B 5/00* | (2006.01) | |
| *H04B 1/00* | (2006.01) | |
| *H01L 23/552* | (2006.01) | |
| *H04B 15/00* | (2006.01) | |
| *H05K 7/14* | (2006.01) | |
| *H01L 27/02* | (2006.01) | |
| *H01L 49/02* | (2006.01) | |
| *H01L 23/48* | (2006.01) | |
| *H01L 23/31* | (2006.01) | |
| *H01L 23/522* | (2006.01) | |
| *H01L 23/00* | (2006.01) | |

(52) U.S. Cl.
CPC .... *H01L 23/4952* (2013.01); *H01L 23/49503* (2013.01); *H01L 23/49541* (2013.01); *H01L 23/49575* (2013.01); *H01L 23/5227* (2013.01); *H01L 27/0248* (2013.01); *H01L 28/10* (2013.01); *H04B 15/005* (2013.01); *H05K 7/14* (2013.01); *H01L 24/48* (2013.01); *H01L 2224/05554* (2013.01); *H01L 2224/48247* (2013.01); *H01L 2224/48257* (2013.01); *H01L 2924/00014* (2013.01)

(58) Field of Classification Search
CPC ....... H01F 2017/0086; H01F 2019/085; H01F 27/28; H01F 27/327; H01F 27/34; H01L 23/495; H01L 23/645; H01L 23/66
USPC ................ 361/813; 455/41.1, 63.1; 257/676
See application file for complete search history.

(56) References Cited

U.S. PATENT DOCUMENTS

| | | | |
|---|---|---|---|
| 5,469,334 A | 11/1995 | Balakrishnan | |
| 5,650,357 A | 7/1997 | Dobkin et al. | |
| 6,285,084 B1 | 9/2001 | Hikita et al. | |
| 6,348,791 B2* | 2/2002 | Shattil | 202/233 |
| 6,384,478 B1 | 5/2002 | Pour | |
| 6,509,807 B1 | 1/2003 | Anthony et al. | |
| 6,518,885 B1 | 2/2003 | Brady et al. | |
| 6,930,584 B2 | 8/2005 | Edo et al. | |
| 6,970,367 B2 | 11/2005 | Takeshima et al. | |
| 6,982,621 B2 | 1/2006 | Park | |
| 6,998,952 B2 | 2/2006 | Zhou et al. | |
| 7,046,114 B2 | 5/2006 | Sakata | |
| 7,091,791 B1 | 8/2006 | Terrovitis | |
| 7,202,790 B2 | 4/2007 | Copeland et al. | |
| 7,276,897 B2* | 10/2007 | Lee | G01D 5/2053 324/207.17 |
| 7,280,024 B2 | 10/2007 | Braunisch | |
| 7,419,838 B2 | 9/2008 | Power et al. | |
| 7,447,492 B2 | 11/2008 | Dupuis | |
| 7,468,547 B2 | 12/2008 | Harvey | |
| 7,524,731 B2 | 4/2009 | Wang | |
| 7,558,080 B2 | 7/2009 | Chen et al. | |
| 7,577,223 B2* | 8/2009 | Alfano | H01L 23/66 375/362 |
| 7,619,297 B2 | 11/2009 | Wang | |
| 7,868,431 B2 | 1/2011 | Feng et al. | |
| 7,884,696 B2 | 2/2011 | Hébert et al. | |
| 8,093,983 B2 | 1/2012 | Fouquet et al. | |
| 8,412,006 B2 | 4/2013 | Tay et al. | |
| 8,427,844 B2* | 4/2013 | Ho | H01F 19/08 257/676 |
| 8,614,566 B2 | 12/2013 | Hatae et al. | |
| 8,772,909 B1 | 7/2014 | Vinciarelli | |
| 8,818,296 B2 | 8/2014 | Kung et al. | |
| 8,976,561 B2 | 3/2015 | Balakrishnan et al. | |
| 9,035,435 B2 | 5/2015 | Balakrishnan et al. | |
| 2003/0042571 A1* | 3/2003 | Chen | H01F 17/0006 257/531 |
| 2004/0214376 A1 | 10/2004 | Gibson et al. | |
| 2005/0224248 A1 | 10/2005 | Gagnon et al. | |
| 2005/0271148 A1 | 12/2005 | Dupuis | |
| 2007/0276270 A1 | 11/2007 | Tran | |
| 2008/0013298 A1 | 1/2008 | Sharma et al. | |
| 2008/0101099 A1* | 5/2008 | Jacobs | H02M 7/06 363/47 |
| 2008/0278256 A1* | 11/2008 | Harvey | H01L 23/495 333/12 |
| 2008/0278275 A1* | 11/2008 | Fouquet | H01F 27/2804 336/84 M |
| 2009/0102543 A1 | 4/2009 | Xiong | |
| 2009/0243028 A1* | 10/2009 | Dong | H01L 23/66 257/499 |
| 2010/0109444 A1* | 5/2010 | Lemmens | H02J 5/005 307/104 |
| 2010/0207771 A1* | 8/2010 | Trigiani | B60L 11/1816 340/636.1 |
| 2010/0270382 A1 | 10/2010 | Koepp et al. | |
| 2011/0121934 A1 | 5/2011 | Hébert et al. | |
| 2011/0254123 A1 | 10/2011 | Sellathamby et al. | |
| 2011/0317450 A1* | 12/2011 | Cheng | H02M 1/4241 363/20 |
| 2012/0146164 A1 | 6/2012 | Ausserlechner | |
| 2012/0307932 A1 | 12/2012 | McCormack et al. | |
| 2013/0024059 A1 | 1/2013 | Miller et al. | |
| 2013/0140370 A1 | 6/2013 | Finn | |
| 2014/0131843 A1 | 5/2014 | Balakrishnan et al. | |
| 2014/0133186 A1 | 5/2014 | Balakrishnan et al. | |
| 2014/0134966 A1 | 5/2014 | Kung et al. | |
| 2014/0204623 A1 | 7/2014 | Djenguerian et al. | |
| 2014/0327108 A1 | 11/2014 | Kung et al. | |
| 2015/0221583 A1 | 8/2015 | Balakrishnan et al. | |

FOREIGN PATENT DOCUMENTS

| | | |
|---|---|---|
| EP | 2 461 335 A1 | 6/2012 |
| JP | 63-031472 | 2/1988 |
| JP | H 09-260569 A | 10/1997 |
| JP | 2006-271172 | 10/2006 |
| JP | 2011-019317 A | 1/2011 |
| JP | 2011-114176 | 6/2011 |

OTHER PUBLICATIONS

"ACPL-W611/ACPL-P611: High CMR, High Speed TTL Compatible Optocoupler," Avago Technologies, Jun. 15, 2006 (10 pages).

"LT5527: 400MHz to 3.7GHz 5V High Signal Level Downconverting Mixer," Linear Technology Corporation, 2005, Version LT 1108 Rev. A (16 pages).

"LTM2881: Complete Isolated RS485/RS422 μModule Transceiver + Power," Linear Technology Corporation, 2009, Version LT 0412 Rev. E (24 pages).

Lu et al., "Research Article: On-Chip Bondwire Magnetics with Ferrite-Epoxy Glob Coating for Power Systems on Chip," International Journal of Power Management Electronics, 2008, vol. 2008, Article ID 678415 (9 pages).

Münzer et al. (n.d.), "Coreless Transformer a New Technology for Half Bridge Driver IC's," Infineon Technologies, (4 pages). Retrieved Jul. 15, 2014.

Münzer et al., "Insulated Signal Transfer in a Half Bridge Driver IC Based on Coreless Transformer Technology," The Fifth International Conference on Power Electroncis and Drive Systems Nov. 17-20, 2003, 2003, 1:93-96.

"NCP4302: Secondary Side Synchronous Flyback Controller," Semiconductor Components Industries, LLC, Jul. 2010, Rev. 3 (16 pages).

Wu et al., "High-Efficiency Silicon-Embedded Coreless Coupled Inductors for Power Supply on Chip Applications," IEEE Transactions on Power Electronics, Nov. 2012, 27(11):4781-4787.

(56) References Cited

OTHER PUBLICATIONS

Krakauer, David, "Digital Isolation Rivals Optocouplers in Terms of Power, Size and Performance," New Electronics, Oct. 25, 2011 (4 pages) http://www.newelectronics.co.uk/electronics-technology/digital-isolation-rivals-optocouplers-in-terms-of-power-size-and-performance/37721/.
EP Patent Application No. 13192743.6—European Search Report, mailed Dec. 7, 2016, 4 pages.
EP Patent Application No. 13192739.4—European Office Action, dated Dec. 19, 2016, 6 pages.
CN Patent Application No. 201310571823.5—Chinese Office Action and Search Report, dated Apr. 27, 2017, with English Machine Translation, 18 pages.
EP Patent Application No. 13192743.6—European Office Action, dated Feb. 1, 2017, 6 pages.
EP Patent Application No. 13192746.9—European Office Action, dated Feb. 9, 2017, 6 pages.
CN Patent Application No. 201310565706.8—Chinese Office Action and Search Report, dated Mar. 9, 2017, with English Machine Translation, 28 pages.
JP Patent Application No. 2013-234822—Japanese Office Action and Search Report with English Translation, dated Jul. 25, 2017, 38 pages.
CN Patent Application No. 2013105663834—Chinese Office Action and Search Report, dated May 11, 2017, with English Machine Translation, 15 pages.

* cited by examiner

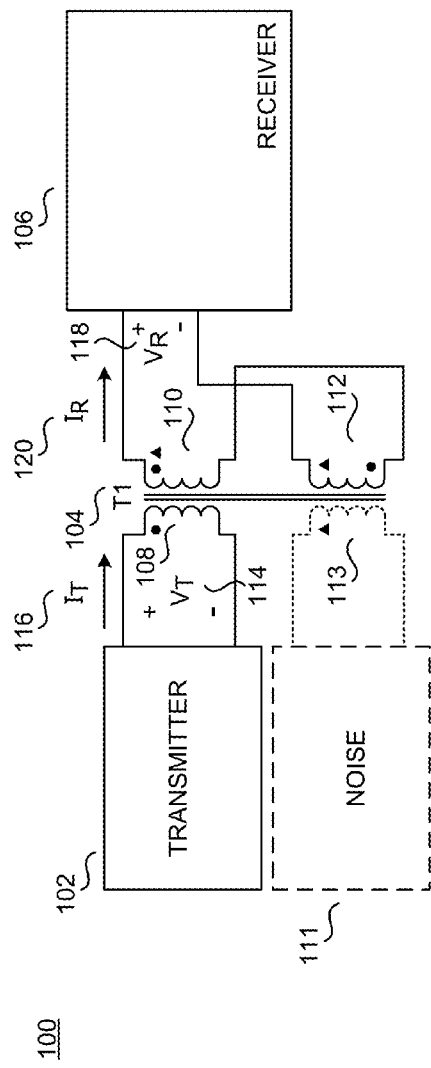
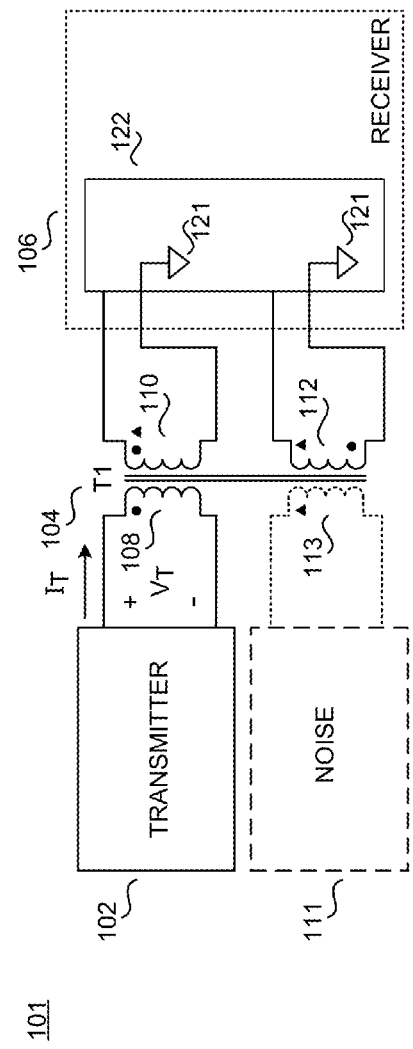
FIG. 1A
FIG. 1B

U.S. 9,831,188 B2

NOISE CANCELLATION FOR A MAGNETICALLY COUPLED COMMUNICATION LINK UTILIZING A LEAD FRAME

RELATED APPLICATIONS

This application is a divisional of U.S. patent application Ser. No. 14/332,743, filed Jul. 16, 2014, now pending, which is a divisional of U.S. patent application Ser. No. 13/677, 068, filed Nov. 14, 2012, now U.S. Pat. No. 8,818,296. U.S. patent application Ser. No. 14/332,743 and U.S. Pat. No. 8,818,296 are hereby incorporated by reference.

This application is related to U.S. patent application Ser. No. 13/677,088 of Balakrishnan et al., filed Nov. 14, 2012, entitled "Magnetically Coupled Galvanically Isolated Communication Using Lead Frame," and assigned to the Assignee of the present application.

This application is also related to U.S. patent application Ser. No. 13/677,120 of Balakrishnan et al., filed Nov. 14, 2012, entitled "Switch Mode Power Converters Using Magnetically Coupled Galvanically Isolated Lead Frame Communication," and assigned to the Assignee of the present application.

BACKGROUND INFORMATION

Field of the Disclosure

The present invention relates generally to communication between a transmitter and receiver, and more specifically to communication between a transmitter and receiver within a single integrated circuit package.

Background

Many electrical devices may rely on a communication system to send information between a transmitter and a receiver to operate the electrical device. One such communication system utilizes magnetically coupled wires to send information between a transmitter and a receiver. Otherwise also known as inductive coupling, a current flowing through one wire induces a voltage across the ends of another wire. The coupling between these wires can be strengthened in various ways. For example, the wires may be wound into coils or a magnetic core may be placed between the wires. Two examples of inductive coupling may be a transformer and a coupled inductor.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

FIG. 1A is a schematic diagram illustrating an example conceptual transmitter receiver system, which may be used to describe the teachings of the present invention.

FIG. 1B is a schematic diagram illustrating another example conceptual transmitter receiver system, which may be used to describe the teachings of the present invention.

Figure 2A:
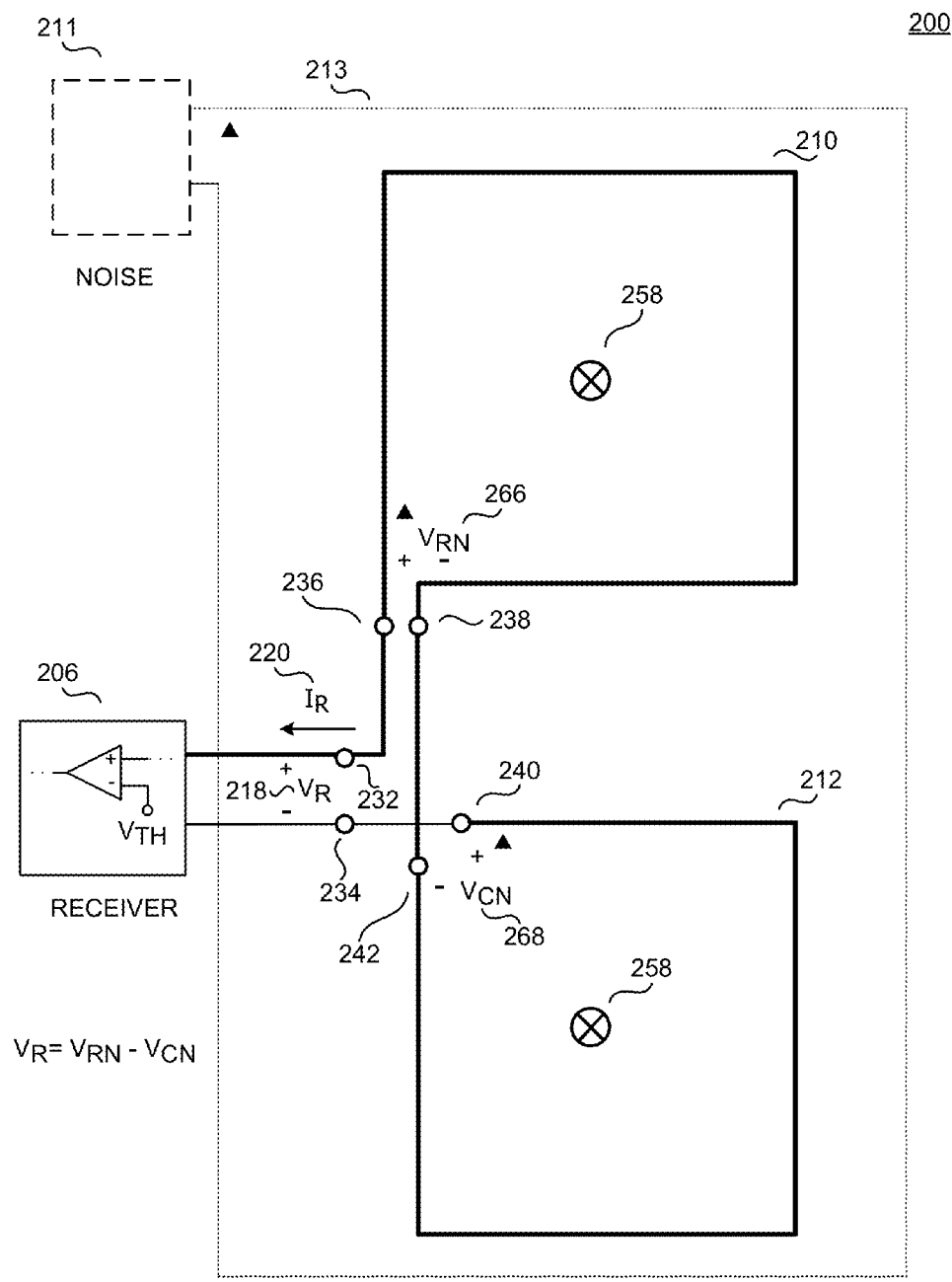
FIG. 2A is a diagram illustrating an example of a conceptual magnetic coupling configuration with a noise cancellation loop, which may be used to describe the teachings of the present invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

In the following description, numerous specific details are set forth in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention.

Reference throughout this specification to "one embodiment", "an embodiment", "one example" or "an example" means that a particular feature, structure or characteristic described in connection with the embodiment or example is included in at least one embodiment of the present invention. Thus, appearances of the phrases "in one embodiment", "in an embodiment", "one example" or "an example" in various places throughout this specification are not necessarily all referring to the same embodiment or example. Furthermore, the particular features, structures or characteristics may be combined in any suitable combinations and/or subcombinations in one or more embodiments or examples. Particular features, structures or characteristics may be included in an integrated circuit, an electronic circuit, a combinational logic circuit, or other suitable components that provide the described functionality. In addition, it is appreciated that the figures provided herewith are for explanation purposes to persons ordinarily skilled in the art and that the drawings are not necessarily drawn to scale.

As mentioned above, electrical devices may utilize magnetic communication between a transmitter and a receiver to operate. One example device may be a synchronous flyback converter. The synchronous flyback converter is an example power converter topology which utilizes two active switches to control the transfer of energy from an input to an output of the power converter. Power converters are commonly used due to their high efficiency, small size, and low weight to power many of today's electronics. One active switch (referred to as a primary switch) is coupled to the primary winding (also referred to as the input winding) of an energy transfer element while the other active switch (referred to as a secondary switch) is coupled to the secondary winding (also referred to as the output winding) of the energy transfer element. In general, a controller controls each active switch. For instance, the primary switch is generally controlled by a primary controller and the secondary switch is generally controlled by a secondary controller. The secondary controller may be one example of a transmitter while the primary controller may be one example of a receiver.

The primary and secondary controllers are utilized to regulate the output of the power converter by sensing and controlling the output of the power converter in a closed loop. More specifically, either the primary or the secondary controller (or both) may be coupled to a sensor that provides feedback information about the output of the power converter in order to regulate the output quantity that is delivered to the load. The output of the power converter is regulated by controlling the turn on and turn off of the primary and secondary switches in response to the feedback information.

Further, the primary and secondary switches cannot be on at the same time in a synchronous flyback converter. In general, an open switch is considered to be off and does not normally conduct current. A closed switch is generally considered to be on and may conduct current. Thus, the primary and secondary controllers of a synchronous flyback converter are synchronized to ensure the primary and secondary switches do not conduct current simultaneously. In other words, the primary and secondary controllers communicate to regulate the output of the power converter and to ensure that the primary and secondary switches are not on at the same time.

In general, the primary and secondary controllers are implemented as integrated circuits (ICs), which are in their own separate integrated circuit packages. External circuits are often used to facilitate communication between the primary and secondary controllers while at the same time provide the necessary galvanic isolation in order to comply with the safety requirements.

An integrated circuit package typically includes a lead frame. The lead frame provides mechanical support for the die or dice that may be within the integrated circuit package. In general, the lead frame typically includes a die attach pad to which a semiconductor die may be attached. In addition, the lead frame generally also includes leads that serve as electrical connections to circuits external from the integrated circuit package. The lead frame is generally constructed from a flat sheet of metal. The flat sheet of metal may be stamped, etched, punched, etc., with a pattern, which defines the die attach pads and various leads of the lead frame. For the purposes of this disclosure, the term "integrated circuit package" refers to the type of packages used generally for integrated circuits. Some embodiments of this invention may have no integrated circuits in the package.

Examples in accordance with the teachings of the present invention utilize the lead frame to provide a magnetically coupled galvanically isolated communication link between a transmitter and receiver as well as provide noise cancellation. In some embodiments, the transmitter and receiver may be within the same integrated circuit package. Embodiments of the invention utilize the lead frame to facilitate communication between the transmitter and receiver using transmitter and receiver loops formed in the lead frame. Further, embodiments of the present invention utilize a cancellation loop formed in the lead frame which may improve the susceptibility to magnetic fields external from the integrated circuit package. These external magnetic fields may also be referred to as noise.

As will be discussed, galvanically isolated conductors are defined in the lead frame, and magnetically coupled conductive loops are defined with the isolated conductors in accordance with the teachings of the present invention. In various examples, the conductive loops included in the conductors of the lead frame may serve as transmit loops, receive loops, and/or cancellation loops. In one example, the receive loop and cancellation loop are substantially the same size and shape and are wound in opposite directions. In an example the receive loop and the transmit loop are magnetically coupled to each other. In addition, the receive loop may be surrounded by the transmit loop. In another example, the receive loop may surround the transmit loop. In one example, the receive loop, the transmit loop and the cancellation loop in the lead frame each consist of one turn. In general, a wrap of wire or other conductive material forming a loop may be considered a turn. Several wraps of wire or other conductive material may be considered multiple turns. Current in an electrical circuit should travel in a closed path. For the purpose of this application, a physical closed path for current may be referred to as a loop. A loop may include different elements such as conductors (that in examples of this disclosure could be formed by lead frame and bond wires inside an integrated circuit package) as well as electrical components that are in path of the circulating current. Each element of the loop forms a part of the loop and a combination of one or more elements in the loop is referred to as a partial loop. In the context of magnetic field coupling, a loop enclosing a magnetic field is typically referred to as having one or more turns. Each turn corresponds to one enclosure of the magnetic field.

The lead frame is generally already a part of integrated circuit packaging. However, by utilizing conductive loops defined by galvanically isolated conductors included in the lead frame itself to provide a magnetically coupled communication link between the transmitter and receiver and provide noise cancellation in accordance with the teachings of the present invention, very little cost is added. Utilizing the lead frame may also reduce the overall size of the power supply. In addition, utilizing the lead frame may also reduce the overall cost of the package.

It is noted that an example isolated synchronous switch mode flyback power converter, in which the secondary controller includes a transmitter circuit and the primary controller includes a receiver circuit is described in the present disclosure for explanation purposes. It is appreciated, however, that other example topologies of switch mode power converters and/or other circuits in general may also benefit from an integrated circuit package including a magnetically coupled communication link defined by galvanically isolated conductive loops included in the lead frame to communicate between the transmitter and receiver and provide noise cancellation in accordance with the teachings of the present invention. Further, while examples in accordance with the teachings of the present invention are discussed in connection with communication between a transmitter and a receiver for explanation purposes, it is appreciated that systems utilizing transceivers may also benefit from the teachings of the present invention.

Referring first to FIG. 1A, a schematic diagram illustrating a conceptual system 100 is shown including a cancellation winding 112 in accordance with the teachings of the present invention. It is appreciated that the conceptual system 100 shown in FIG. 1A is utilized to explain teachings of the present invention. As illustrated in FIG. 1A, system 100 includes a magnetic coupling element 104 that has a transmitter winding 108, a receiver winding 110 and a cancellation winding 112. In the illustrated example, one end of receiver winding 110 is coupled to one end of cancellation winding 112 as shown. A transmitter 102 is coupled to transmitter winding 108 and a receiver 106 is coupled to receiver winding 110 and cancellation winding 112 as shown. Further shown in FIG. 1A, transmitter winding 108 conducts a transmitter current $I_T$ 116 and there is a transmitter voltage $V_T$ 114 across transmitter winding 108. Receiver winding 110 and cancellation winding 112 conduct a receiver current $I_R$ 120 and there is a receiver voltage $V_R$ 118 across receiver winding 110 and cancellation winding 112 as shown. In addition, FIG. 1A illustrates a noise block 111 and a noise winding 113. It should be appreciated however, that the noise block 111 and noise winding 113 are illustrative and are included in FIG. 1A to model the effects of noise on the system 100 for explanation purposes rather than representing a physical noise generating circuit block 111 coupled to a winding 113 wound on magnetic coupling element 104.

It is also noted that the dots and triangles shown in FIG. 1A represent the direction of current and polarity of voltage that one winding induces in another due to the magnetic coupling between the windings. In particular, the dot denotes the direction of current and the polarity of voltage induced in the receiver winding 110 and cancellation winding 112 due to the magnetic coupling from the transmitter winding 108. The triangle denotes the direction of current and polarity of voltage induced in the receiver winding 110 and cancellation winding 112 due to the magnetic coupling from noise winding 113. In other words, the dots and triangles help to illustrate the relationship of the windings with respect to each other, which will also be discussed in further detail below with respect to FIGS. 2A and 2B.

Transmitter 102 is coupled to the transmitter winding 108 of magnetic coupling element T1 104 such that the transmitter current $I_T$ 116 flows into the transmitter winding 108, as indicated by the dot shown in FIG. 1A. In addition, the voltage drop across the transmitter winding 108 is indicated by the dot and is denoted as transmitter voltage $V_T$ 114. Magnetic coupling element T1 104 also includes a receiver winding 110 and cancellation winding 112. One end of the receiver winding 110, which is the end indicated by both the dot and the triangle in FIG. 1A, is coupled to the receiver 106, while the end of the cancellation winding 112 indicated by the triangle is further coupled to the receiver 106 as shown in FIG. 1A. The end of the receiver winding without the dot and triangle is coupled to the end of the cancellation winding 112 indicated by the dot as shown in FIG. 1A. The voltage received by receiver 106 is denoted as receiver voltage $V_R$ 118, and the corresponding current is denoted as receiver current $I_R$ 120. The transmitter 102 may send information to the receiver 106 through the magnetic coupling between the transmitter winding 108, receiver winding 110, and cancellation winding 112. The transmitter 102 may communicate information as a voltage signal and/or a current signal and the receiver 106 may receive the information as a voltage signal and/or current signal. In embodiments, the transmitter 102 may communicate information utilizing the transmitter current $I_T$ 116. In one example, circuits within transmitter 102 may control various properties of the transmitter current $I_T$ 116 to communicate information to the receiver 106. When the transmitter current $I_T$ 116 is changing in magnitude, it produces a changing magnetic field in the proximity of a conductor. In embodiments, both the receiver winding 110 and cancellation winding 112 are conductors. Due to the laws of electromagnetic induction, a voltage is generated across a conductor that is subjected to a changing magnetic field. In embodiments therefore, receiver voltage $V_R$ 118 is induced due to the changing magnetic field generated by changes in transmitter current $I_T$ 116 and may result in receiver current $I_R$ 120. The receiver 206 includes circuits which may receive the transmitter induced voltage and/or current and interpret the voltage and/or current as information. Properties of the transmitter current $I_T$ 116 which may be controlled to communicate information may include the magnitude and the rate of change of the transmitter current $I_T$ 116. The communicated signals may take the form of digital information or of analog information. In the case of digital information, communication can be in the form of binary signals or more complex encoded digital data as will be known to one skilled in the art. It should be appreciated that other communication techniques may be used. In other examples, communication techniques which take advantage of the relationship between the transmitter current $I_T$ 116 and the resultant induced receiver voltage $V_R$ 118 and receiver current $I_R$ 120 received by the receiver 106 may be utilized.

Further illustrated in FIG. 1A is a noise block 111 and a noise winding 113. It is appreciated that block 111 and noise winding 113 are shown in dashed lines in FIG. 1A for the purpose of modeling the effects of noise on the system 100. In particular, noise that is external to the system 100 may impact the transmission of information between the transmitter 102 and receiver 106. For example, noise block 111 may correlate to other electronics or systems that produce unwanted electromagnetic interference (EMI). Thus, noise winding 113 correlates to the effects that noise block 111 has on system 100. In other words, noise block 111 and noise winding 113 may be utilized to model the effects of external magnetic fields on the system 100.

As shown in FIG. 1A, the current $I_T$ 116 in the transmitter winding 116 may induce a current and voltage in the receiver winding 110 as indicated by the dot. The induced current flows out from the end of the receiver winding 110 indicated by the dot. There is a voltage drop from the end of the receiver winding 110 indicated by the dot to the other end of receiver winding 110. Transmitter current $I_T$ 116 also induces a current and voltage in the cancellation winding 112 as indicated by the dot. The induced current flows out from the end of the cancellation winding 112 indicated with a dot. There is a voltage drop from the end of the cancellation winding 112 indicated by the dot to the other end of cancellation winding 112.

The cancellation winding 112 is magnetically coupled out of phase with the transmitter winding 108. As shown in FIG. 1A, the position of the dot for the cancellation winding 112 is in the opposite location from the position of the dot for the transmitter winding for the respective windings. The transmitter winding 114 is however, magnetically coupled in phase with the receiver winding 110. The position of the dot for both the transmitter winding 114 and the receiver winding 110 is in the same corresponding location for the respective windings. Further, the cancellation winding 112 and the receiver winding 110 are magnetically coupled out of phase with each other. As shown, the cancellation winding 112 and the receiver winding 110 create a "figure eight" shape in the illustrated example. Stated in another way, the cancellation winding 112 and the receiver winding 110 are wound in opposite directions with respect to each other. For instance the cancellation winding 112 may be wound in a clockwise direction and the receiver winding would then be wound in a counter-clockwise direction.

In various examples, the coupling of one end of the receiver winding 110 to one end of the cancellation winding 112 as shown may strengthen received signals from the transmitter 102, as will be further discussed below with respect to FIG. 2B. The transmitter current $I_T$ 116 induces a current and voltage for both receiver winding 110 and the cancellation winding 112. Receiver current $I_R$ 120 is the current that flows through both the receiver winding 110 and cancellation winding 112. In addition, the transmitter 102 induced receiver voltage $V_R$ 118 is the combination or sum of the voltages across receiver winding 110 and cancellation winding 112.

Noise, such as for example external magnetic fields, which is modeled as noise block 111 and noise winding 113, may also induce a voltage in the receiver winding 110 and cancellation winding 112. The voltage drop in the receiver winding 110 is from the end of the receiver winding 110 indicated by the triangle to the other end of receiver winding 110. In addition, the voltage drop in the cancellation winding 112 due to noise is from the end of the cancellation winding 112 indicated by the triangle to the other end of cancellation winding 112.

Both the receiver winding 110 and the cancellation winding 112 are magnetically coupled in phase with the noise winding 113. As illustrated in FIG. 1A, the position of the triangle is in the same corresponding location for the noise winding 113, receiver winding 110, and cancellation winding 112. However, as mentioned above, the receiver winding 110 and the cancellation winding 112 are magnetically coupled out of phase to each other. The noise induced receiver voltage $V_R$ 118 is the difference between the voltage across the receiver winding 110 and the cancellation winding 112. If the receiver winding 110 and cancellation winding 112 are substantially similar in size and number of turns, there is substantially no receiver current $I_R$ 120 due to noise and the receiver voltage $V_R$ 118 due to noise is substantially zero. In other words, in the illustrated example, as the receiver winding 110 and cancellation winding 112 are substantially similar in size and number of turns, the noise signal component induced in the receiver winding 110 in response to the noise winding 113 is substantially equal and opposite to the noise signal component induced in the cancellation winding 112 in response to the noise winding 113. As such, the noise signal components induced in each respective receiver winding 110 and cancellation winding 112 substantially cancel out each other.

For communication between a transmitter and receiver within an integrated circuit package, the transmitter winding 108, receiver winding 110, and cancellation winding 112 may be implemented using magnetically coupled galvanically isolated conductive loops defined in the lead frame of the integrated circuit package in accordance with the teachings of the present invention, as will be further discussed below with respect to FIGS. 3, 4, and 5.

FIG. 1B illustrates a schematic of another conceptual system 101 including transmitter 102, magnetic coupling element 104, receiver 106, transmitter winding 108, receiver winding 110, cancellation winding 112, and an arithmetic operator 122. Further shown in FIG. 1B is transmitter voltage $V_T$ 114 and transmitter current $I_T$ 116. In addition, FIG. 1B illustrates noise block 111 and noise winding 113. It is appreciated that the conceptual system 101 shown in FIG. 1B is utilized to explain teachings of the present invention.

It is appreciated that system 101 shown in FIG. 1B shares many similarities with the system 100 shown in FIG. 1A. However, one difference is that instead of being coupled together as shown in FIG. 1A, the receiver winding 110 and the cancellation winding 112 are separately coupled to an arithmetic operator 122 in FIG. 1B. In particular, as shown in FIG. 1B, both ends of the receiver winding 110 and both ends of the cancellation winding 112 are each separately coupled to arithmetic operator 122. As mentioned above, the transmitter 102 induces a current and voltage in both the receiver winding 110 and the cancellation winding 112. Noise from noise block 111 may also affect the induced current and voltages of the receiver winding 110 and the cancellation winding 112. In the illustrated example, the arithmetic operator 122 may receive the induced voltages and currents of the receiver winding 110 and the cancellation winding 112 as input signals.

In addition, in the example one end of the receiver winding 110 and one end of the cancellation winding 112 are coupled to ground 121. As illustrated, the end of the receiver winding 110 without the dot and triangle is coupled to ground 121. For the cancellation winding 112, the end of the winding denoted by the dot is coupled to ground 121.

In one example, the arithmetic operator 122 includes a circuit that may perform a number of arithmetic operations such as addition, subtraction, multiplication and division to the various inputs to the arithmetic operator 122 to provide a resultant output. In various examples, the various inputs and outputs of the arithmetic operator 122 may include current signals, voltage signals or both. In one example, the arithmetic operator 122 may perform subtraction. For the example shown in FIG. 1B, both the receiver winding 110 and the cancellation winding 112 are magnetically coupled in phase with the noise winding 113. As such, the arithmetic operator 122 would subtract the magnitude of the voltage or current of the cancellation winding 112 from the magnitude of the voltage or current of the receiver winding 110 and result in substantially zero voltage or current. In other words, the receiver 122 may subtract the magnitude of the signal provided by the receiver winding 110 from the magnitude of the signal provided by the cancellation winding.

In the illustrated example, the receiver winding 110 is coupled in phase with the transmitter winding 108 while the cancellation winding 112 is coupled out of phase with the transmitter winding 108. In one embodiment, the arithmetic operator 122 is a subtractor. However, since the transmitter winding 108 and the cancellation winding 112 are coupled out of phase, the signal induced in cancellation winding 112 due to a transmit signal in winding 108 would provide to the arithmetic operator 122 a signal of opposite polarity. The resultant arithmetic operation is effectively addition thus acting to supplement the receive signal from winding 110. Thus, magnetically coupled signals induced in receiver winding 110 and the cancellation winding 112 due to a changing magnetic field generated by current flow in the transmitter winding 108 are additive. As such, the information sent by the transmitter 102 is strengthened.

For communication between a transmitter and receiver within an integrated circuit package, the transmitter winding 108, receiver winding 110, and cancellation winding 112 may be implemented using magnetically coupled galvanically isolated conductive loops defined in the lead frame of the integrated circuit package in accordance with the teachings of the present invention, as will be further discussed below with respect to FIGS. 3 and 4.

FIG. 2A illustrates an example conceptual magnetic coupling configuration of a system 200 with a cancellation loop 212. It is appreciated that the conceptual system 200 shown in FIG. 2A is utilized to explain teachings of the present invention. System 200 includes a receiver 206, a receiver loop 210 (which is one example of receiver winding 110), a cancellation loop 212 (which is one example of cancellation winding 112), nodes 232, 234, 236, 238, 240, and 242, and marker 258. Further shown in FIG. 2A is a receiver voltage $V_R$ 218, a receiver current $I_R$ 220, a voltage $V_{RN}$ 266, and a voltage $V_{CN}$ 268. In addition, FIG. 2A illustrates noise block 211 and noise loop 213 (which is one example of noise winding 113). It should be appreciated however, that noise block 211 and noise winding 213 are included in FIG. 2A to model the effects of noise on the system 200. FIG. 2A is one example of a magnetic coupling configuration of the receiver winding and cancellation winding illustrated in FIG. 1A. The transmitter and transmitter winding are not shown in FIG. 2A, but will be discussed below with respect to FIG. 2B.

As illustrated, receiver loop 210 includes nodes 236 and 238 located proximate to the ends of receiver loop 210 while cancellation loop 212 includes nodes 240 and 242 located proximate to the ends of cancellation loop 212 and receiver 206 includes nodes 232 and 234. Receiver loop 210 and cancellation loop 212 are coupled to receiver 206 such that node 232 of the receiver 206 is coupled to node 236 of receiver loop 210, node 234 of the receiver 206 is coupled to node 240 of cancellation loop 212, and node 238 of the receiver loop 210 is coupled to node 242 of the cancellation loop 212. In the example illustrated in FIG. 2A the receiver loop 210 and the cancellation loop 212 are illustrated as substantially similar squares and are wound in opposite directions as shown. As in other various examples, the receiver loop 210 and cancellation loop 212 may be substantially the same size and shape. In one embodiment, the areas substantially surrounded by the receiver loop 210 and the cancellation loop 212 are substantially the same size. However, it should be appreciated that the receiver loop 210 and cancellation loop 212 may be different sizes and/or shapes. Further, in some embodiments, the areas substantially surrounded by the receiver loop 210 and the cancellation loop 212 may be different.

Further, the voltage drop between nodes 232 and 234 is denoted as receiver voltage $V_R$ 218. The voltage drop between nodes 236 and 238 is denoted as voltage $V_{RN}$ 266 and the voltage drop between nodes 240 and 242 is denoted as voltage $V_{CN}$ 268. Receiver current $I_R$ 220 is illustrated as current flowing from node 232 to receiver 206.

In addition, FIG. 2A illustrates noise block 211 and noise winding 213, which is used to model the effects of noise, such as external magnetic fields, to the system 200 on both the receiver winding 210 and cancellation winding 212. As illustrated, the noise winding 213 substantially surrounds the receiver winding 210 and cancellation winding 212. Triangles shown in FIG. 2A denote the polarity of the receiver loop 210 and cancellation loop 212 with respect to the noise loop 213.

In FIG. 2A, noise is modeled as noise block 211 and current flowing in noise loop 213. For the example shown, current in the noise loop 213 is flowing in a clockwise direction and generates a magnetic field that passes through planes of both the receiver loop 210 and the cancellation loop 212. Markers 258 illustrate the overall magnetic field that passes through both receiver loop 210 and cancellation loop 212. In general, the "X" symbol as illustrated for markers 258 denotes magnetic field or flux into the page, while a dot symbol for a marker symbol denotes magnetic field or flux out from the page. Due to the positioning of the receiver loop 210 and cancellation loop 212 with respect to the noise loop 213, the overall effects of the magnetic field on both receiver loop 210 and the cancellation loop 212 are substantially similar as the magnetic field or flux from the noise loop passes through the planes of both receiver loop 210 and the cancellation loop 212 in substantially the same direction into the page, as illustrated in the example of FIG. 2A with markers 258.

The change in magnetic fields that passes through the planes of the receiver loop 210 and cancellation loop 212 induces an electric field for both loops. For the example shown in FIG. 2A, the direction of the electric field for receiver loop 210 and cancellation loop 212 is in a counter clockwise direction for increasing magnetic field strength in the direction shown by marker 258. In other words, the increasing magnetic field due to noise winding 213 induces a voltage drop across nodes 236 and 238, denoted as voltage $V_{RN}$ 266, which is the voltage of the receiver loop 210 due to noise. The changing magnetic field due to the noise also induces a voltage drop across nodes 240 and 242, denoted as voltage $V_{CN}$ 268, which is the voltage of the cancellation loop 212 due to noise. Triangles shown in FIG. 2A denote the polarity of the receiver loop 210 and cancellation loop 212 with respect to the noise loop 213.

In various examples, due to the coupling of the receiver loop 210 and the cancellation loop 212, the receiver voltage $V_R$ 218 is determined according to equation (1):

$$V_R = V_{RN} - V_{CN} \tag{1}$$

Thus, the receiver voltage $V_R$ 218 received by receiver 206 is the difference between the voltage $V_{RN}$ 266 and the voltage $V_{CN}$ 268. Both the receiver loop 210 and the cancellation loop 212 are coupled in phase with the noise loop 213. However, both receiver loop 210 and the cancellation loop 212 are coupled out of phase with each other. Indeed, in the illustrated example, receiver loop 210 is wound in an opposite direction from cancellation loop 212. Thus, if the receiver loop 210 and cancellation loop 212 are substantially the same size and shape and the magnetic fields that pass through the planes of both loops are substantially the same, then the magnitudes of voltages $V_{RN}$ 266 and $V_{CN}$ 268 are substantially the same. The receiver 206 would receive substantially no voltage due to noise. Further, the receiver 206 would receive no current due to noise. As such, the effects of noise to the receiver 206 may be substantially minimized. In addition, it should be appreciated that the effects of noise are still cancelled if the direction of the magnetic field due to noise is out of the page. For that case, markers 258 would be the dot symbols instead of the "X" symbols, and the receiver voltage $V_R$ 218 is still the difference between the magnitudes of voltage $V_{RN}$ 266 and voltage $V_{CN}$ 268.

Figure 3:
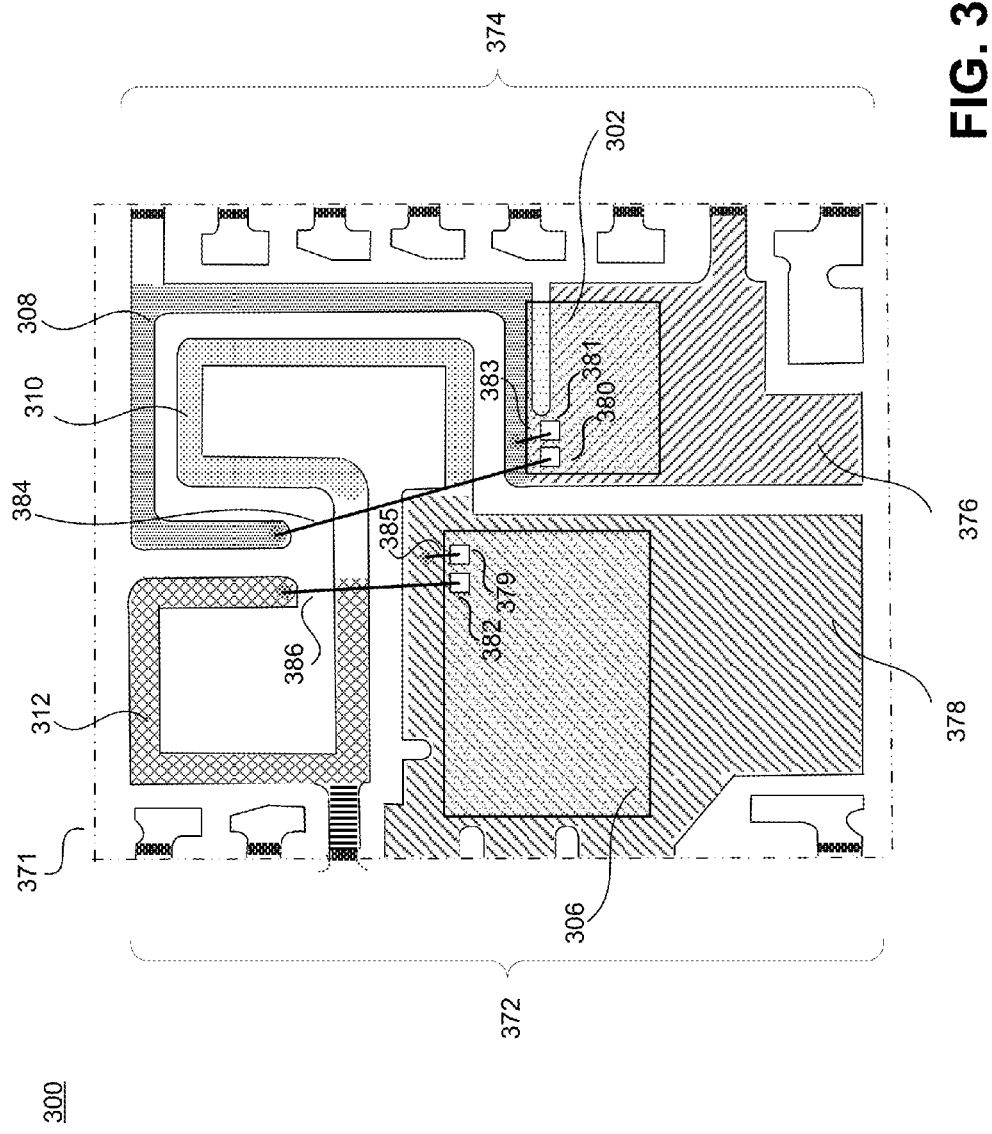
FIG. 3 is a diagram illustrating an example lead frame of an integrated circuit package in accordance with teachings of the present invention.
Figure 4:
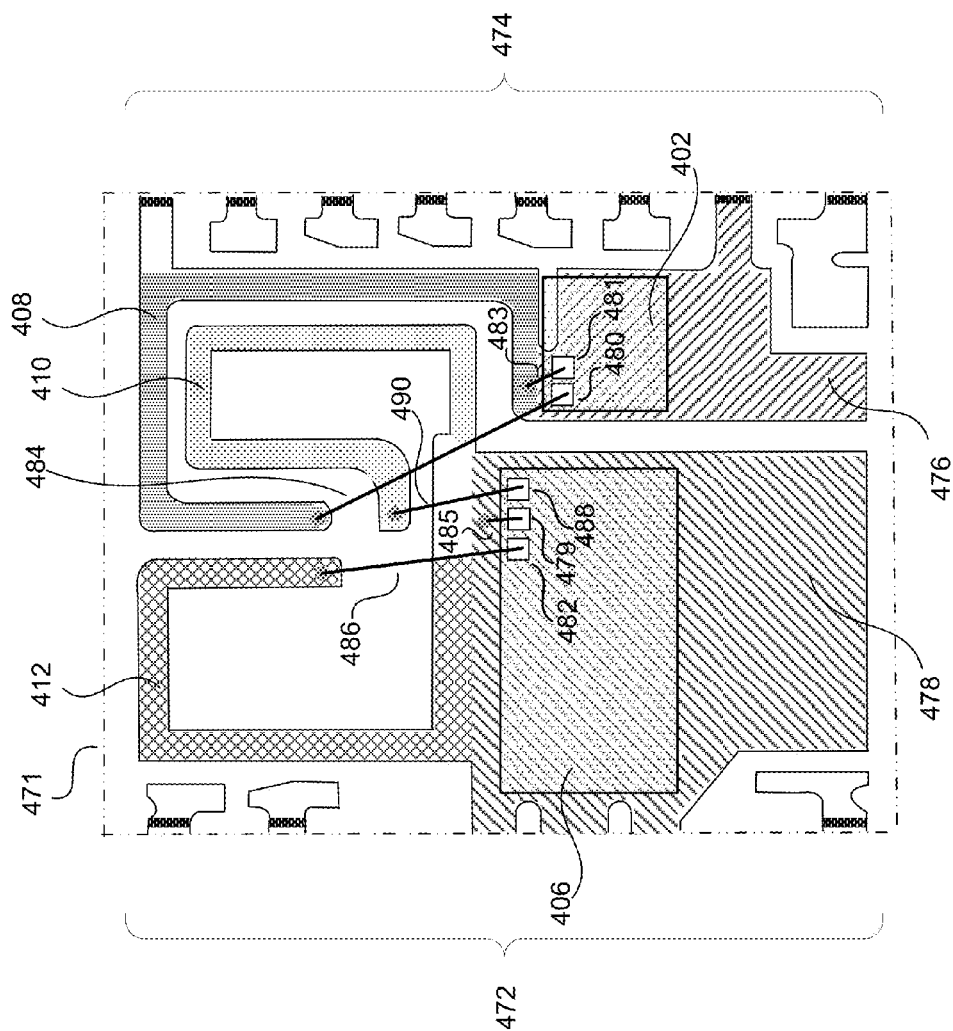
FIG. 4 is a diagram illustrating another example lead frame of an integrated circuit package in accordance with teachings of the present invention.
Figure 5:
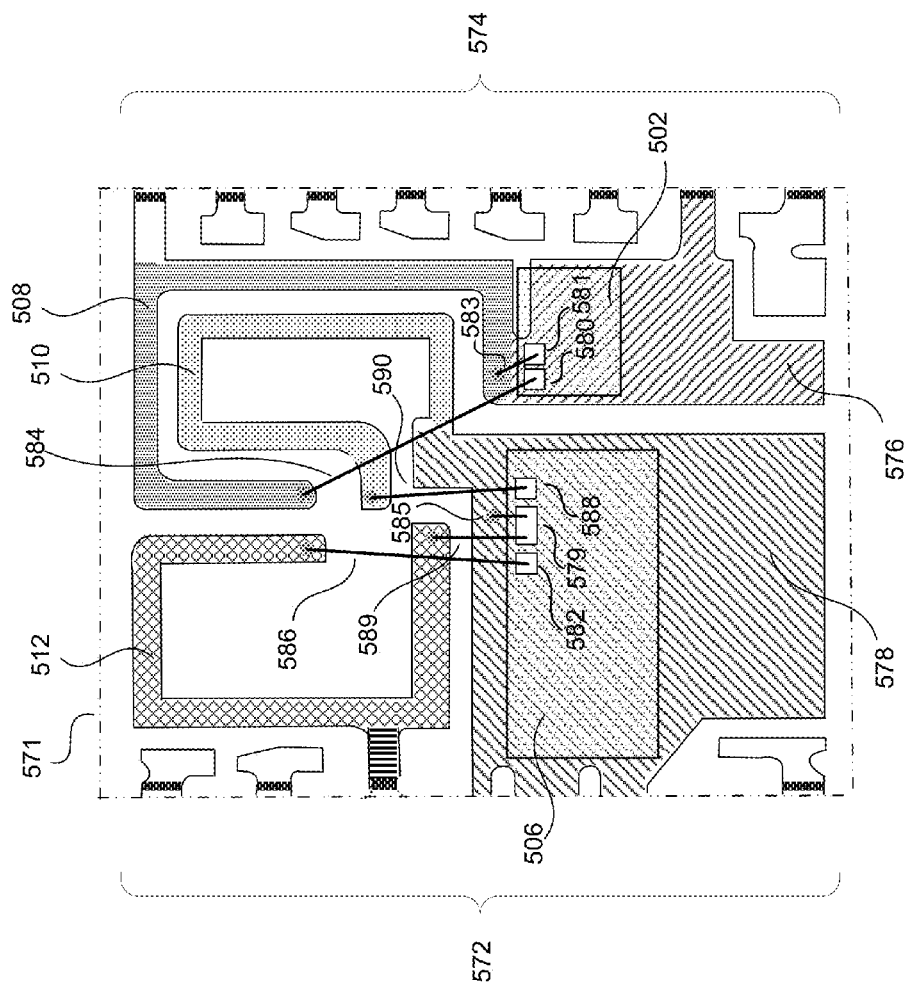
FIG. 5 is a diagram illustrating yet another example lead frame of an integrated circuit package in accordance with teachings of the present invention.

For communication between a transmitter and a receiver within an integrated circuit package, the transmitter winding 108, receiver winding 110, and cancellation winding 112 may be implemented using magnetically coupled galvanically isolated conductive loops defined in the lead frame of the integrated circuit package in accordance with the teachings of the present invention, as will be further discussed with respect to FIGS. 3, 4, and 5. Examples of the present invention include a transmitter and receiver within the same integrated circuit package which utilize conductive loops formed in the lead frame to communicate. Magnetic fields produced outside the integrated circuit package may be considered external magnetic fields while magnetic fields produced by components within the integrated circuit package may be considered internal magnetic fields. The magnetic field produced by the current in the noise loop 213 may model an external magnetic field which may interfere with communication between the transmitter and receiver. Embodiments of the present invention utilize the cancellation loop 212 to reduce the effects which external magnetic fields may have on communications between the transmitter and receiver.

Figure 2B:
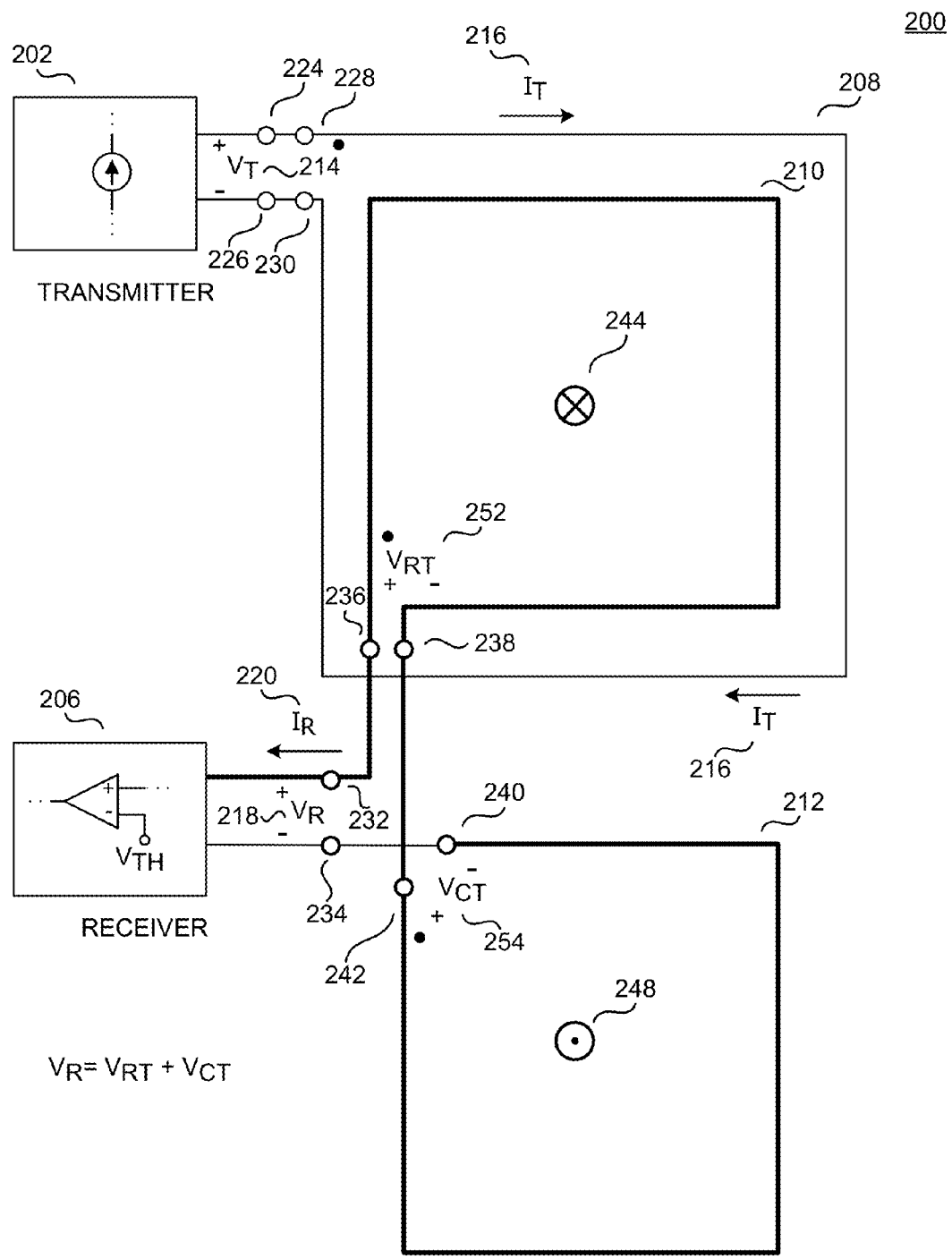
FIG. 2B is a diagram illustrating another example of a conceptual magnetic coupling configuration with a noise cancellation, which may be used to describe the teachings of the present invention.

FIG. 2B illustrates an example conceptual magnetic coupling configuration of a system 200 with a cancellation loop 212. It is appreciated that the conceptual system 200 shown in FIG. 2B is utilized to explain teachings of the present invention. System 200 includes a transmitter 202, receiver 206, a transmitter loop 208 (which is one example of transmitter winding 108), receiver loop 210, cancellation loop 212, nodes 224, 226, 228, 230, 232, 234, 236, 238, 240, and 242, and markers 244 and 248. Further shown in FIG. 2B is transmitter voltage $V_T$ 214, transmitter current $I_T$ 216, receiver voltage $V_R$ 218, receiver current $I_R$ 220, a voltage $V_R$ T 252, a voltage $V_{CT}$ 254. FIG. 2B illustrates one example of a magnetic coupling configuration of the receiver winding and cancellation winding illustrated in FIG. 1A.

The receiver 206, receiver loop 210 and cancellation loop 212, are coupled as described above with respect to FIG. 2A. Further shown is transmitter 202 and transmitter loop 208. Transmitter 202 includes nodes 224 and 226 while transmitter loop 208 includes nodes 228 and 230. Nodes 224 and 226 of the transmitter 202 are coupled to nodes 228 and 230 of the transmitter loop 208, respectively. As illustrated, the receiver loop 210 is substantially surrounded by the transmitter loop 208. Further, the voltage drop across node 224 and 226 (or in other words, across node 228 and 230) is denoted as transmitter voltage $V_T$ 214. FIG. 2B also shows transmitter current $I_T$ 216, which is shown as flowing from node 224 to node 226 through the transmitter loop 208.

For the example shown in FIG. 2B, transmitter current $I_T$ 216 in the transmitter loop 208 flows in a clockwise direction and generates a magnetic field which passes through both the receiver loop 210 and the cancellation loop 212. Markers 244 and 248 illustrate the overall magnetic field seen by both receiver loop 210 and cancellation loop 212 due to the current in transmitter loop 208. Due to the positioning of the receiver loop 210 and cancellation loop 212 with respect to the transmitter loop 208, the receiver loop 244 experiences an overall magnetic field as going into the page, as illustrated with the "X" symbol for maker 244, while the cancellation loop 212 experiences an overall magnetic field out of the page, as illustrated with the dot symbol for marker 248. When the transmitter 202 and receiver 206 are within the same integrated circuit package, the magnetic field produced by the transmitter current $I_T$ 216 may be considered an internal magnetic field.

The change in magnetic fields experienced by the receiver loop 210 and cancellation loop 212 induces an electric field for both loops. For the example shown, the direction of the electric field for the receiver loop 210 is in the counter clockwise direction while the direction of the electric field for the cancellation loop 212 is in the clockwise direction for increasing magnetic field strength in the directions shown by markers 244 and 248. In other words, the changing magnetic field due to transmitter loop 208 induces a voltage drop across the ends of receiver loop 210 at nodes 236 and 238, denoted as voltage $V_{RT}$ 252, which is the voltage of the receiver loop 210 due to the transmitter 202. The changing magnetic field also induces a voltage drop across the ends of cancellation loop 212 at nodes 242 and 240, denoted as voltage $V_{CT}$ 254, which is the voltage of the cancellation loop 212 due to the transmitter 202. Dots shown in FIG. 2B denote the polarity of the receiver loop 210 and cancellation loop 212 with respect to the transmitter loop 208.

As discussed above, the transmitter 202 may communicate information utilizing the transmitter current $I_T$ 216. Circuits within transmitter 202 may control various properties of the transmitter current $I_T$ 216 to communicate information to the receiver 206. When the transmitter current $I_T$ 216 is changing in magnitude, it produces a changing magnetic field which induces a voltage across the receiver winding 210 and cancellation winding 212 due to the laws of electromagnetic induction. In embodiments, receiver voltage $V_R$ 218 is induced due to the changing magnetic field generated by changes in transmitter current $I_T$ 216 and may result in receiver current $I_R$ 220. Circuits included in the receiver 206 may receive the transmitter induced voltage and/or current and interpret the voltage and/or current as information. Properties of the transmitter current $I_T$ 216 which may be controlled to communicate information may include the magnitude and the rate of change of the transmitter current $I_T$ 216. The communicated signals may take the form of digital information or of analog information. In the case of digital information, communication can be in the form of binary signals or more complex encoded digital data as will be known to one skilled in the art. It should be appreciated that other communication techniques may be used. In other examples, communication techniques which take advantage of the relationship between the transmitter current $I_T$ 216 and the resultant induced receiver voltage $V_R$ 218 and receiver current $I_R$ 220 received by the receiver 206 may be utilized.

In one example, the transmitter 202 may include a controlled current source which produces the transmitter current $I_T$ 216. The controlled current source may vary properties of the transmitter current $I_T$ 216 to communicate information to the receiver 206. Further, the receiver 206 may include a comparator which compares the receiver voltage $V_R$ 218 with a reference voltage $V_{TH}$. The receiver 206 may utilize the output of the comparator to interpret the information communicated by the transmitter 202. For the example of a flyback converter in which the secondary controller may be a transmitter and the primary controller may be a receiver circuit and, the secondary controller may communicate information to the primary controller to turn on or off the primary switch to regulate the output of the power converter. The secondary controller (transmitter) may produce the transmitter current $I_T$ (utilizing a controlled current source) when the primary switch should be turned on. When the primary controller (receiver) receives an induced receiver voltage $V_R$, which is greater than a reference voltage $V_{TH}$, the primary controller processes the information to determine whether to turn on the primary switch. In one example, the absence of the transmitter current $I_T$ (and hence receiver voltage $V_R$) could indicate to the primary controller (receiver) to not turn on the primary switch.

The receiver loop 210 is magnetically coupled in phase with the transmitter loop 208 while the cancellation loop 212 is magnetically coupled out of phase with the transmitter loop 208. In addition, the cancellation loop 212 and the receiver loop 210 are magnetically coupled out of phase to each other. In various examples, due to the magnetic coupling of the receiver loop 210 and the cancellation loop 212, the receiver voltage $V_R$ 218 is determined according to equation (2):

$$V_R = V_{RT} + V_{CT} \qquad (2)$$

Thus, the receiver voltage receiver voltage $V_R$ 218 is the sum of the voltage $V_{RT}$ 252 and the voltage $V_{CT}$ 254. As such, the information sent by transmitter 202 may be strengthened with the addition of cancellation loop 212 in accordance with the teachings of the present invention. Thus, it is appreciated that magnetically coupled signals induced in receiver winding 210 and the cancellation winding 212 due to a changing magnetic field generated by current flow in the transmitter winding 208 are additive.

For communication between a transmitter and receiver within an integrated circuit package, the transmitter winding 108, receiver winding 110, and cancellation winding 112 may be implemented using magnetically coupled galvanically isolated conductive loops defined in the lead frame of the integrated circuit package in accordance with the teachings of the present invention, as will be further discussed with respect to FIGS. 3, 4, and 5.

To illustrate, FIG. 3 shows an example lead frame 300 disposed substantially within an encapsulated portion of an integrated circuit package in accordance with the teachings of the present invention. In the illustrated example, lead frame 300 includes a first conductor including a receiver conductive loop 310 (which is one example of receiver loop 210) and a cancellation conductive loop 312 (which is one example of cancellation loop 212). As shown in the illustrated example, lead frame 300 also includes a second conductor that is galvanically isolated from the first conductor. In the illustrated example, the second conductor includes transmitter conductive loop 308 (which is one example of transmitter loop 208). As shown in the illustrated example, the transmitter conductive loop 308 is disposed proximate to the receiver conductive loop 310 to provide a magnetically coupled communication link between the transmitter conductive loop 308 and the receiver conductive loop 310 in accordance with the teachings of the present invention. In addition, FIG. 3 also shows leads 372 and 374, a die attach pad 376, and a die attach pad 378. The square numbered as 371 illustrates the encapsulated portion of the lead frame 300. In other words, elements within the encapsulation 371 are disposed within the encapsulated portion of the integrated circuit package. Further shown in FIG. 3 is a transmitter 302, a receiver 306, pads 379, 380, 381, and 382, and bond wires 383. 384, 385 and 386. FIG. 3 is one example of a magnetic coupling configuration of a transmitter winding, receiver winding, and cancellation winding as discussed with respect to the FIGS. 1A, 2A, and 2B.

In one example, transmitter 302 and receiver 306 are implemented as circuits in integrated circuit dice included within the encapsulated portion of the integrated circuit package. The die attach pad 376, which is part of the second conductor of lead frame 300, is denoted by diagonal cross-hatching in FIG. 3 and denotes the portion of the lead frame 300 onto which transmitter 302 is mounted. Similarly, the die attach pad 378, which is part of the first conductor of lead frame 300, is shaded with diagonal cross-hatching in FIG. 3 and denotes the portion of the lead frame 300 onto which the receiver 306 is mounted. In one example, the receiver 306 and transmitter 302 are attached to the respective isolated first and second conductors of the lead frame 300 utilizing an adhesive. The adhesive may be non-conductive. In another example, the adhesive may be conductive. In one example, the slot in die attach pad 376 shown under the transmitter 302 may make the transmitter conductive loop 308 longer. As such, the current through the transmitter conductive loop 308 may flow closer and parallel to the receiver conductive loop 310 to improve magnetic coupling.

Leads 372 and 374 denote portions of the lead frame 300 which may couple to circuits that are external to the integrated circuit package (in other words, outside of profile 371). Although not shown, various bond wires may couple either the transmitter 302 or the receiver 306 to any of the leads 372 or 374.

The portion of the lead frame 300 shaded by densely packed dots in FIG. 3 corresponds to the transmitter conductive loop 308. The portion of lead frame 308 and bond wires 383 and 384 complete the transmitter conductive loop. In one example, bond wire 384 is attached to the portion of lead frame 300 corresponding to the transmitter conductive loop 308 utilizing known bonding techniques. Further, the bond wire 384 is coupled to transmitter 302 through pad 380. Bond wire 383 is attached to the portion of the die attach pad 376 corresponding to the transmitter conductive loop 308 utilizing known bonding techniques. Further the bond wire 383 is coupled to the transmitter 302 through pad 381. In one example, bondwire 383 and pad 381 provide the coupling to ground for the transmitter conductive loop 308.

The portion of the lead frame 300 shaded by dots in FIG. 3 corresponds to the receiver conductive loop 310. Further portion of the lead frame 300 shaded by cross-hatching in FIG. 3 corresponds to the cancellation conductive loop 312. The portion of the lead frame corresponding to both the receiver conductive loop and the cancellation conductive loop may be considered a first conductor while the portion of the lead frame corresponding to the transmitter conductive loop 308 may be considered a second conductor. Bond wire 386 is attached to the portion of lead frame 300 corresponding to cancellation conductive loop 312 utilizing known bonding techniques. Bond wire 386 couples the cancellation conductive loop 312 to the receiver 306 through pad 382 to complete the receiver conductive loop 310 and cancellation conductive loop 312. Further, bond wire 385 is attached to die attach pad 378 using known bonding techniques and is coupled to the receiver 306 through pad 379. In one example, bond wire 385 and pad 379 provide the coupling to ground for the receiver conductive loop 310 and the cancellation conductive loop 312. As shown in the example depicted in FIG. 3, beginning from a reference point such as for example pad 379, receiver conductive loop 310 is wound in a counter-clockwise direction while cancellation conductive loop 312 is wound in an opposite or clockwise direction relative to receiver conductive loop 310. As illustrated, the transmitter conductive loop 308 substantially surrounds the receiver conductive loop 310 and the receiver conductive loop 310 is magnetically coupled out of phase with the cancellation conductive loop 312. In the illustrated example, transmitter conductive loop 308 is wound in the clockwise direction from a reference point such as pad 380 of transmitter 302. In general, the transmit signal is sent from the pad 380 in a clockwise direction around transmitter conductive loop 308. In one example, the transmitter conductive loop 308 substantially surrounds the receiver conductive loop 310. In one example, the transmitter conductive loop 308, the receiver conductive loop 310, and the cancellation conductive loop 312 are all encapsulated in insulating material within the encapsulated portion of the integrated circuit package and are all disposed substantially in the same plane.

By utilizing galvanically isolated magnetically coupled conductive loops of the lead frame to provide a communications link between the transmitter and receiver with noise cancellation, very little cost is added. In addition, utilizing the lead frame may also reduce the overall size of the power converter and the cost of the package in accordance with the teachings of the present invention.

FIG. 4 illustrates another example of a lead frame 400 disposed substantially within the encapsulated portion of an integrated circuit package in accordance with the teachings of the present invention. In the illustrated example, lead frame 400 includes a first conductor including receiver conductive loop 410 (which is one example of receiver loop 110) and a cancellation conductive loop 412 (which is one example of cancellation winding 112). As shown in the illustrated example, lead frame 400 also includes a second conductor that is galvanically isolated from the first conductor. In the illustrated example, the second conductor includes transmitter conductive loop 408 (which is one example of transmitter winding 108). As shown in the illustrated example, the transmitter conductive loop 408 is disposed proximate to the receiver conductive loop 410 to provide a magnetically coupled communication link between the transmitter conductive loop 408 and the receiver conductive loop 410 in accordance with the teachings of the present invention. In addition, FIG. 4 also shows leads 472 and 474, die attach pad 476, and die attach pad 478. The square numbered as 471 illustrates the profile of the lead frame 400 that is disposed within the encapsulated portion of the integrated circuit package. In other words, elements within the profile 471 are disposed within the encapsulated portion of the integrated circuit package. Further shown in FIG. 4 are a transmitter 402, a receiver 406, pads 479, 480, 481, 482, and 488, and bond wires 483, 484, 485, 486, and 490. FIG. 4 is one example of a magnetic coupling configuration of a transmitter winding, receiver winding, and cancellation winding as discussed with respect to the FIG. 1B.

It is appreciated that the lead frame 400 illustrated in FIG. 4 shares many similarities with the lead frame 300 illustrated in FIG. 3 with the addition of pad 488 and bond wire 490. Further, the signals produced by receiver conductive loop 410 and cancellation conductive loop 412 are received separately by receiver 406.

The portion of the lead frame 400 shaded by dots in FIG. 4 corresponds to the receiver conductive loop 410. Bond wire 490 is attached to the portion of the lead frame 400 corresponding to the receiver conductive loop 410 utilizing known bonding techniques. Bond wire 490 couples to receiver 406 through pad 488 to complete the receiver conductive loop 410. In addition, the portion of the lead frame 400 shaded by cross-hatching in FIG. 4 corresponds to the cancellation conduction loop 412. Bond wire 486 is attached to the portion of the lead frame 400 corresponding to the cancellation conduction loop 412 utilizing known bonding techniques. Further, the bond wire 486 couples to receiver 406 through pad 482 to complete the cancellation conduction loop 412. Further, bond wire 485 is attached to die attach pad 478 using known bonding techniques and is coupled to the receiver 406 through pad 479. In one example, bond wire 485 and pad 479 provide the coupling to ground for both the receiver conductive loop 410 and the cancellation conductive loop 412. As shown in the example depicted in FIG. 4, beginning from a reference point such as for example pad 479, receiver conductive loop 410 is wound in a counter-clockwise direction while cancellation conductive loop 412 is wound in an opposite or clockwise direction relative to receiver conductive loop 410. In the illustrated example, transmitter conductive loop 408 is wound in the clockwise direction from a reference point such as pad 480 of transmitter 402. In general, the transmit signal is sent from the pad 480 in a clockwise direction around transmitter conductive loop 408. In one example, the transmitter conductive loop 408 substantially surrounds the receiver conductive loop 410. In one example, the transmitter conductive loop 408, the receiver conductive loop 410, and the cancellation conductive loop 412 are all encapsulated in insulating material within the encapsulated portion of the integrated circuit package and are all disposed substantially in the same plane.

FIG. 5 illustrates another example lead frame 500 disposed substantially within the encapsulated portion of an integrated circuit package in accordance with the teachings of the present invention. In the illustrated example, lead frame 500 includes a first conductor including receiver conductive loop 510 (which is one example of receiver loop 110). In one example, the lead frame 500 also includes a third conductor including the cancellation conductive loop 512 (which is one example of cancellation winding 112). However, as will be discussed in further detail below, in another example the first conductor may also include the cancellation conductive loop 512. As shown in the illustrated example, lead frame 500 also includes a second conductor that is galvanically isolated from the first conductor. In the illustrated example, the second conductor includes transmitter conductive loop 508 (which is one example of transmitter winding 108). As shown in the illustrated example, the transmitter conductive loop 508 is disposed proximate to the receiver conductive loop 510 to provide a magnetically coupled communication link between the transmitter conductive loop 508 and the receiver conductive loop 510 in accordance with the teachings of the present invention. In addition, FIG. 5 also shows leads 572 and 574, die attach pad 576, and die attach pad 578. The square numbered as 571 illustrates the profile of the lead frame 500 that is disposed within the encapsulated portion of the integrated circuit package. In other words, elements within the profile 571 are disposed within the encapsulated portion of the integrated circuit package. Further shown in FIG. 5 are a transmitter 502, a receiver 506, pads 579, 580, 581, 582, and 588, and bond wires 583, 584, 585, 586, 589, and 590. FIG. 5 is another example of a magnetic coupling configuration of a transmitter winding, receiver winding, and cancellation winding as discussed with respect to the FIG. 1B.

It is appreciated that the lead frame 500 illustrated in FIG. 5 shares many similarities with the lead frame 400 illustrated in FIG. 4. One difference, however, is that the cancellation conductive loop 512 is coupled to die attach pad 578 and receiver conductive loop 510 through a connection through receiver 506. For instance, in one example, the cancellation conductive loop 512 is coupled to die attach pad 578 through pad 579 and bond wires 585 and 589. FIG. 5 also shows the addition of pad 588 and bond wire 590. Thus, both the receiver conductive loop 510 and cancellation conductive loop 512 are coupled together and are therefore included as part of the first conductor as they are coupled together through receiver 506 in the depicted example.

The portion of the lead frame 500 shaded by dots in FIG. 5 corresponds to the receiver conductive loop 510. Bond wire 590 is attached to the portion of the lead frame corresponding to the receiver loop 510 utilizing known bonding techniques. Bond wire 590 attaches to pad 588, which is coupled to receiver 506 to complete the receiver conductive loop 510. Further, bond wire 585 is attached to die attach pad 578 using known bonding techniques and is coupled to the receiver 506 through pad 579. In one example, bond wire 585 and pad 579 provide the coupling to ground for both the receiver conductive loop 510 and the cancellation conductive loop 512.

In addition, the portion of the lead frame 500 shaded by cross-hatching in FIG. 5 corresponds to the cancellation conductive loop 512. Bond wire 586 is attached to the portion of the lead frame 500 corresponding to the cancellation conductive loop 512 utilizing known bonding techniques. Further, the bond wire 586 attaches to pad 582, which is coupled to receiver 506 to complete the cancellation conductive loop 512. Bond wire 589 attaches to the cancellation conductive loop utilizing known techniques and is coupled to receiver 506 through pad 579. As shown in the example depicted in FIG. 5, beginning from a reference point such as for example pad 579, receiver conductive loop 510 is wound in a counter-clockwise direction while cancellation conductive loop 512 is wound in an opposite or clockwise direction relative to receiver conductive loop 510. In the illustrated example, transmitter conductive loop 508 is wound in the clockwise direction from a reference point such as pad 580 of transmitter 502. In general, the transmit signal is sent from the pad 580 in a clockwise direction around transmitter conductive loop 508. In one example, the transmitter conductive loop 508 substantially surrounds the receiver conductive loop 510. In one example, the transmitter conductive loop 508, the receiver conductive loop 510, and the cancellation conductive loop 512 are all encapsulated in insulating material within the encapsulated portion of the integrated circuit package and are all disposed substantially in the same plane.

Figure 6:
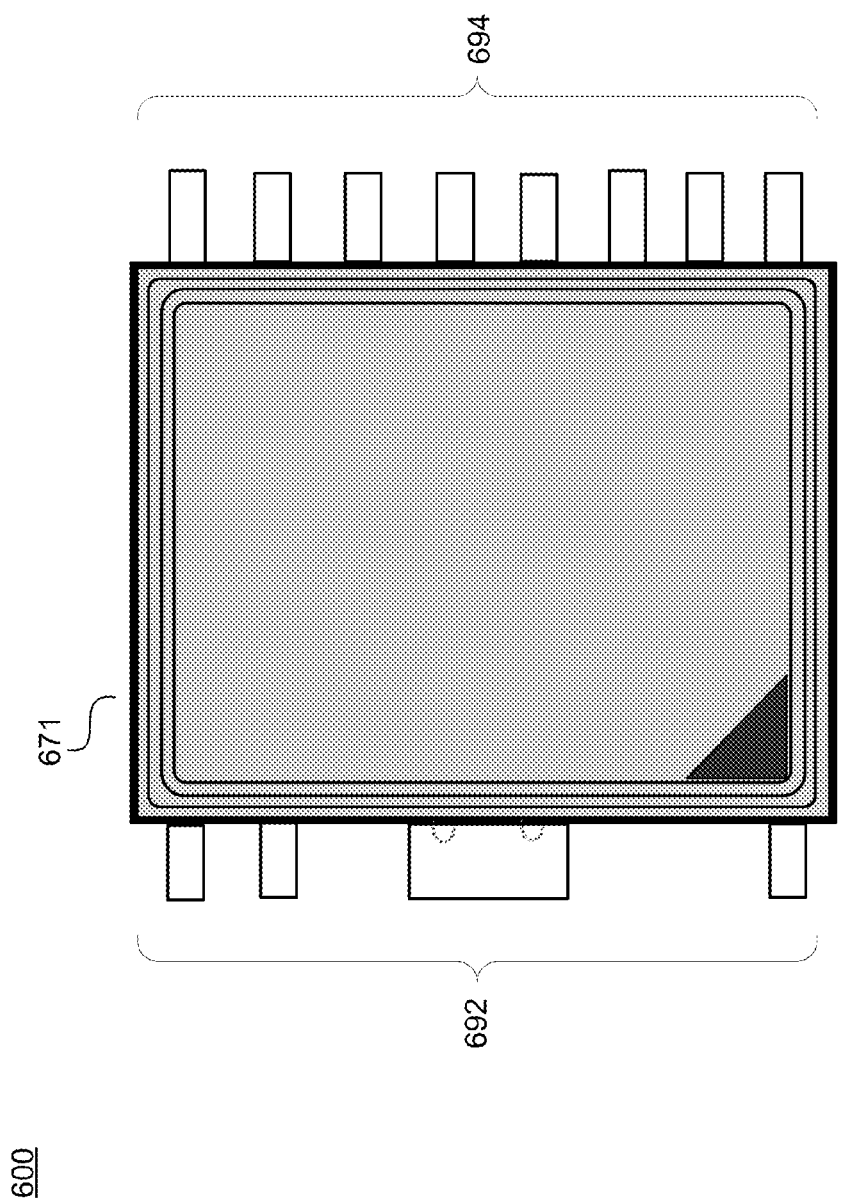
FIG. 6 is a diagram illustrating an example integrated circuit package, in accordance with teachings of the present invention.

FIG. 6 illustrates an example integrated circuit package 600, in accordance with teachings of the present invention. The outline 671 represents the encapsulated portion of integrated circuit package 600 and is analogous to the profiles 371, 471, and 571 shown in FIGS. 3, 4 and 5. The outline 671 denotes the profile and encapsulated portion of integrated circuit package 600. Terminals 692 and 694 couple to leads internal to the integrated circuit package 600, such as leads 372 and 374, leads 472 and 474, or leads 572 and 574 shown above in FIGS. 3, 4, and 5. Circuits external to the integrated circuit package 600 may then be coupled to terminals 692 and 694.

For purposes of this disclosure, an "encapsulation" of an integrated circuit package may be considered to be any external body, encasing or molding that surrounds or encloses a portion of the lead frame which may include one or more integrated circuit dice disposed therein, as well as connections from the integrated circuit die pads to the lead frame and pins of the integrated circuit package. An example encapsulation may be made from molded plastic, ceramic caps or the like. In some examples, the encapsulation of the integrated circuit package may or may not provide hermetic sealing to protect the items encased therein from external elements.

Those that are skilled in the art would appreciate that the galvanic isolation provided by communication link built according to teachings of this invention need not necessarily be preserved at the system level to benefit from the teachings of this invention. For example, the communication link may be used to communicate between two parts of a non-isolated power converter system such a buck converter, half bridge converter and the like, that are referenced to different voltages or that have changing voltage levels between them.

The above description of illustrated examples of the present invention, including what is described in the Abstract, are not intended to be exhaustive or to be limitation to the precise forms disclosed. While specific embodiments of, and examples for, the invention are described herein for illustrative purposes, various equivalent modifications are possible without departing from the broader spirit and scope of the present invention. Indeed, it is appreciated that the specific example voltages, currents, frequencies, power range values, times, etc., are provided for explanation purposes and that other values may also be employed in other embodiments and examples in accordance with the teachings of the present invention.

What is claimed is:

1. An integrated circuit package, comprising:
   an encapsulation;
   a lead frame, a portion of the lead frame disposed within the encapsulation, the lead frame comprising:
      a first conductive loop having a first end and a second end, wherein a first voltage is induced between the first and second ends of the first conductive loop in response to an external magnetic field that passes through the integrated circuit package; and
      a second conductive loop having a third end and a fourth end, wherein a second voltage is induced between the third and fourth ends in response to the external magnetic field that passes through the integrated circuit package, wherein the first conductive loop is coupled to the second conductive loop such that the first voltage between the first and second ends is substantially canceled by the second voltage between the third and fourth ends.

2. The integrated circuit package of claim 1 wherein a direction along which the external magnetic field passes through a plane of the first conductive loop is substantially the same as a direction along which the external magnetic field passes through a plane of the second conductive loop.

3. The integrated circuit package of claim 2 wherein the plane of the first conductive loop is substantially the same as the plane of the second conductive loop.

4. The integrated circuit package of claim 1 wherein the second end of the first conductive loop is coupled to the fourth end of the second conductive loop, wherein a combined voltage induced in response to the external magnetic field between the first end and the third end is substantially zero.

5. The integrated circuit package of claim 1, wherein the first conductive loop and the second conductive loop are coupled to a receiver circuit.

6. The integrated circuit package of claim 1 wherein a direction along which a signal magnetic field passes through a plane of the first conductive loop is substantially opposite to a direction along which the signal magnetic field passes through a plane of the second conductive loop.

7. The integrated circuit package of claim 6 wherein a third voltage is induced between the first and second ends of the first conductive loop in response to the signal magnetic field, and wherein a fourth voltage is induced between the third and fourth ends of the second conductor in response to the signal magnetic field.

8. The integrated circuit package of claim 7 wherein the second end of the first conductive loop is coupled to the fourth end of the second conductive loop, wherein a combined voltage induced in response to the signal magnetic field between the first end and the third end is substantially equal to a sum of the third and fourth voltages.

9. The integrated circuit package of claim 1, wherein the first conductive loop is coupled out of phase with the second conductive loop.

10. The integrated circuit package of claim 1 further comprising an arithmetic operator circuit coupled to the first and second ends of the first conductive loop to receive the first voltage, and coupled to the third and fourth ends of the second conductive loop to receive the second voltage, wherein the arithmetic operator circuit is coupled to perform an arithmetic operation on the first and second voltages.

11. The integrated circuit package of claim 10 wherein the arithmetic operator circuit is coupled to perform a subtraction operation on the first and second voltages.

12. The integrated circuit package of claim 1 further comprising a third conductive loop disposed within the encapsulation proximate to the first conductive loop to provide a communication link between the first and third conductive loops.

13. The integrated circuit package of claim 12 further comprising a transmitter circuit coupled to the third conductive loop.

14. The integrated circuit package of claim 1 wherein the first conductive loop and the second conductive loop are substantially the same size.

* * * * *